(12) United States Patent
Ummelmann

(10) Patent No.: US 7,944,288 B2
(45) Date of Patent: May 17, 2011

(54) SWITCHED-CAPACITOR AMPLIFIER ARRANGEMENT HAVING A LOW INPUT CURRENT

(75) Inventor: Detlef Ummelmann, Munich (DE)

(73) Assignee: Infineon Technologies AG, Neubiberg (DE)

( * ) Notice: Subject to any disclaimer, the term of this patent is extended or adjusted under 35 U.S.C. 154(b) by 92 days.

(21) Appl. No.: 12/240,274

(22) Filed: Sep. 29, 2008

(65) Prior Publication Data

US 2010/0079204 A1 Apr. 1, 2010

(51) Int. Cl.
 *H03F 1/02* (2006.01)
(52) U.S. Cl. .......................... 330/9; 330/109
(58) Field of Classification Search ............ 330/9, 107, 330/109; 327/554, 124
See application file for complete search history.

(56) References Cited

U.S. PATENT DOCUMENTS

| | | | |
|---|---|---|---|
| 4,355,285 A | 10/1982 | Kelley et al. | |
| 4,543,534 A | 9/1985 | Temes et al. | |
| 5,479,130 A * | 12/1995 | McCartney | 327/341 |
| 5,617,093 A | 4/1997 | Klein | |
| 5,796,300 A | 8/1998 | Morgan | |
| 7,088,280 B2 | 8/2006 | Oprescu | |
| 2009/0091383 A1* | 4/2009 | Jeon et al. | 330/86 |

FOREIGN PATENT DOCUMENTS

EP 0 834 992 B1 8/1998

OTHER PUBLICATIONS

Off-line Power Supply Controller, Unitrode, Data sheet SLUS159A, Revised Feb. 2003, 1 page.
Lacerda, F., et al., "A Differential Switched-Capacitor Amplifier with Programmable Gain and Output Offset Voltage," SBCCI Proceedings of the 19th annual symposium on Integrated circuits and systems design, Aug. 28-Sep. 1, 2006, Sociedade Brasileira de Computação.

* cited by examiner

*Primary Examiner* — Hieu P Nguyen
(74) *Attorney, Agent, or Firm* — Slater & Matsil, L.L.P.

(57) ABSTRACT

An SC amplifier arrangement and a method for measuring an input voltage are described.

21 Claims, 6 Drawing Sheets

US 7,944,288 B2

SWITCHED-CAPACITOR AMPLIFIER ARRANGEMENT HAVING A LOW INPUT CURRENT

TECHNICAL FIELD

Embodiments of the invention relate to switched capacitor circuits.

BACKGROUND

SC amplifier arrangements (SC is short for switched capacitor) comprise an SC amplifier having an input capacitor that is connected to an input of the SC amplifier arrangement by a clock-controlled switch. A mean input current, and hence an input impedance, of such an SC amplifier arrangement depends on a capacitance of the input capacitor.

SC amplifier arrangements can be used in instrumentation circuits for measuring electrical voltages. In this application, the voltage to be measured is applied to the input of the SC amplifier arrangement. The input current of the SC amplifier arrangement can here cause a change or error in the voltage to be measured, and hence a measurement error. This effect is more pronounced the higher the output impedance of a signal source supplying the voltage to be measured and the higher the input current of the SC amplifier arrangement.

SUMMARY

This description of a first aspect relates to an SC amplifier arrangement, which comprises: an input for applying an input voltage and an output for providing an output voltage; at least one SC amplifier stage comprising: a first input capacitor, at least one switch, which is designed to connect under clock control the input capacitor to the input, an amplifier, which has an amplifier input, to which the input capacitor is connected, and an amplifier output, which is connected to the output, and a feedback circuit, which is connected between the amplifier output and the at least one amplifier input of the amplifier; at least one compensation circuit, which is connected between the output and the input and which has a compensation capacitor and a switching arrangement, with the switching arrangement being designed to connect under clock control the compensation capacitor between the output and the input.

A further aspect relates to a method for measuring an input voltage applied to an input, which comprises: during a first clock phase, clock-controlled charging of an input capacitor to a voltage that depends on the input voltage; amplification of the voltage lying across the input capacitor by an amplifier to provide an output voltage at an output; feeding back electric charge from the output to the input during a second clock phase.

SHORT DESCRIPTION OF THE FIGURES

Examples are explained in greater detail below with reference to figures. These figures are used to explain the basic principle, so that only those aspects necessary to understanding this basic principle are shown. The figures are not necessarily to scale. Unless stated otherwise, in the figures, the same reference numerals denote identical features having the same relevance.

DETAILED DESCRIPTION OF THE FIGURES

Figure 1:
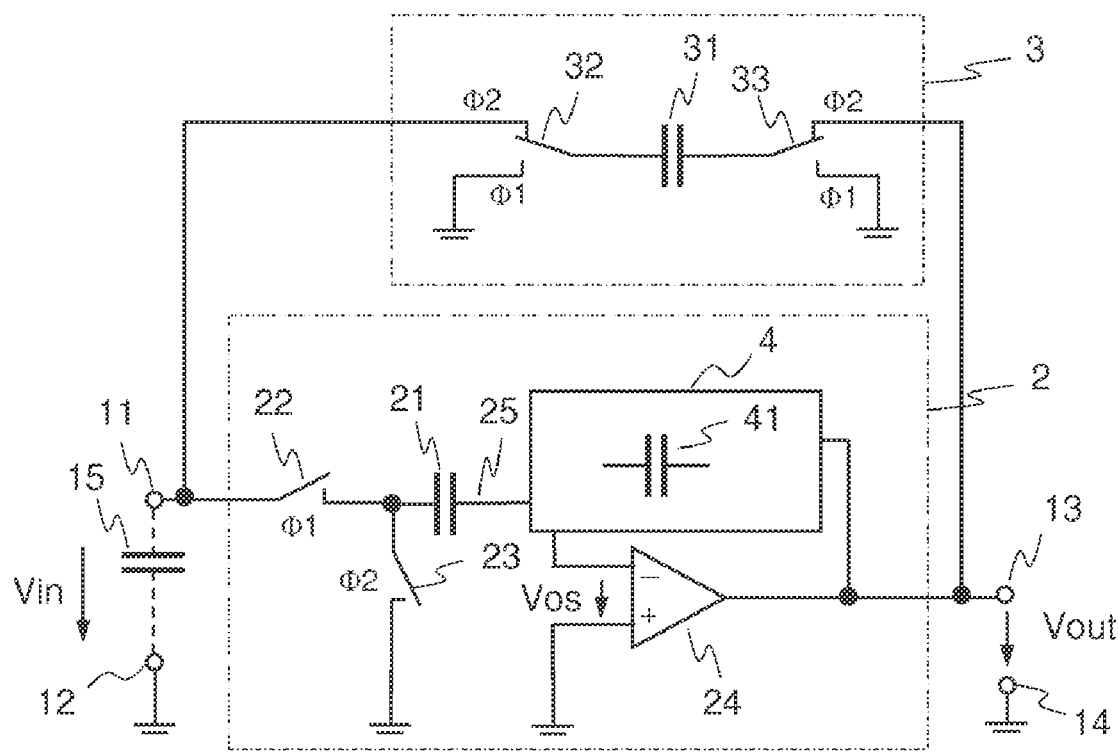
FIG. 1 shows a first example of an SC amplifier arrangement comprising an input, an output, an SC amplifier stage connected between the input and the output, and a compensation circuit connected between the output and the input.

FIG. 1 uses an electrical equivalent circuit to show a first example of an SC amplifier arrangement. The SC amplifier arrangement in the example shown comprises an input for inputting an input voltage Vin and an output for providing an output voltage Vout. In the example shown, the input comprises two input terminals 11, 12, between which the input voltage Vin lies, and the output comprises two output terminals 13, 14, between which the output voltage Vout lies. In the example shown, one terminal 12 of the input terminals and one terminal 14 of the output terminals lie at a reference potential, to which are referred the voltages appearing in the SC amplifier arrangement.

The SC amplifier arrangement has an SC amplifier stage 2, which is connected between the input 11, 12 and the output 13, 14. This SC amplifier stage 2 comprises a first input capacitor 21, a first switch 22, an amplifier 24 and a feedback circuit 4. The amplifier 24 is an operational amplifier, for example, and comprises two inputs: a first amplifier input, which in the example shown is an inverting input, and a second amplifier input, which in the example shown is a non-inverting input. The amplifier 24 also comprises an amplifier output, which, in the example shown, is connected to one of the output terminals 13, 14, in the example shown a first output terminal 13. The feedback circuit 4 is connected between the amplifier output on the one side, and on the other side to one of the amplifier inputs, in the example shown the first amplifier input, and the input capacitor 21. The reference number 25 denotes in FIG. 1 a circuit node common to the feedback circuit 4 and the input capacitor.

The first switch 22 is designed to connect under clock control the first input capacitor 21 between the input of the SC amplifier arrangement and one of the amplifier inputs. For this purpose, the first input capacitor 21, in the example shown, is connected in series with the first switch 22 between the first input terminal 11 and the first amplifier input 25. This first switch 22 is used to charge under clock control the first input capacitor 21 during each first clock phase to a voltage that depends on the input voltage Vin. The second amplifier input, in the SC amplifier stage 2 shown, lies at the reference potential. In the ideal case, the input voltage of the amplifier 24, i.e. the voltage between the amplifier inputs, is zero. In this case, the electrical potential at the first amplifier input 25, i.e. a node common to the first input capacitor 21 and the first amplifier input, also equals the reference potential.

If the amplifier 24 has an offset, then there is an offset voltage Vos between the amplifier inputs, which does not equal zero and which can equal several mV. Both cases are considered in the explanation below, i.e. both the ideal case with an input voltage of zero and the non-ideal case with an offset voltage Vos between the amplifier inputs.

The SC amplifier stage 2, in the example shown, has a second switch 23, which is connected between a node common to the first switch 22 and the first input capacitor 21. This second switch 23 is designed to connect under clock control that terminal of the input capacitor 21 that is remote from the amplifier input to the reference potential, and to do this offset in time from those clock phases in which the first switch 22 is closed and hence the input capacitor 21 is connected to the input 11, 12 of the SC amplifier arrangement.

Figure 2:
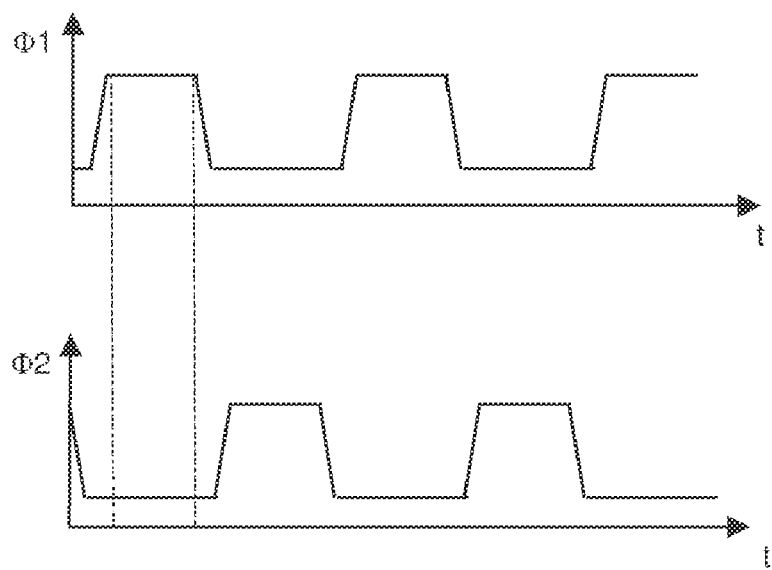
FIG. 2 shows by way of example time waveforms of clock signals used in the SC amplifier arrangement.

The first and second switches 22, 23 together form a switching arrangement, which is designed to connect under clock control that terminal of the first input capacitor 21 remote from the first amplifier input alternately to the first input terminal 11 and to the reference potential. One means of controlling these two switches 22, 23, for example, is by two non-overlapping clock signals $\Phi 1$, $\Phi 2$. Examples of time waveforms of these clock signals $\Phi 1$, $\Phi 2$ are shown in FIG. 2. Each of these clock signals $\Phi 1$, $\Phi 2$ alternately assumes an ON level and an OFF level, with a switch controlled by one of the clock signals being in the ON state when the clock signal assumes an ON level, and in the OFF state when the clock signal assumes an OFF level.

The two clock signals can have the same clock frequency, but are phase-shifted with respect to each other such that the two clock signals $\Phi 1$, $\Phi 2$ never simultaneously have an ON level, so that the two switches 22, 23 are never driven in the conducting state at the same time. One means of controlling the two switches 22, 23 is to use a non-overlapping 2-phase clock, i.e. the two clock signals are selected so that they never simultaneously have an ON level. For example to do this, they are phase-shifted with respect to each other by 180° and have OFF time intervals that are longer than their ON time intervals. A first clock phase refers below to a time interval during which the first clock signal $\Phi 1$ assumes an ON level, and a second clock phase refers below to a time interval during which the second clock signal $\Phi 2$ assumes an ON level. In FIG. 1, the clock signal controlling a particular switch is shown beside each of the switches.

In the SC amplifier stage 2 shown, the first input capacitor 21 is charged during each first clock phase to the input voltage Vin, or to the differential voltage between the input voltage Vin and offset voltage Vos. During each second clock phase, the first input capacitor 21 is discharged into the feedback circuit 4, which comprises a switched capacitor 41. This switched capacitor 41 is discharged during the first clock phase, and receives during the second clock phase the electric charge previously stored in the first input capacitor 21.

A gain factor G of the SC amplifier stage equals the ratio of a change in the output voltage $\Delta$Vout and a corresponding change in the input voltage $\Delta$Vin, i.e.:

$$G = \frac{\Delta Vout}{\Delta Vin}. \tag{1}$$

It is a well-known fact that the gain factor G can be set by the properties of the feedback circuit 4, which shall be explained further below. During each first clock phase, the SC amplifier stage 2 receives electric charge via the input terminals 11, 12, which is stored in the first input capacitor 21. The charge $Q_{c21-1}$ stored in the first input capacitor 21 during the first clock phase is given by:

$$Q_{C21-1} = Vin \cdot C21 \tag{2}$$

where C21 denotes the capacitance of the first input capacitor 21.

The input voltage Vin lies across a second input capacitor 15, for example, which is connected between the input terminals 11, 12. The electric charge received by the SC amplifier stage 2 during the first clock phase results in a partial discharge of this second input capacitor 15 and can cause an error in the measurement result, in particular, when a signal source (not shown) supplying the input voltage Vin has such a high output impedance that electric charge would be removed from the second input capacitor 15 faster than it can be restored by the signal source, if no additional measures are taken.

In order at least to reduce the effect of the measurement on the input voltage Vin, a compensation circuit 3 is provided in the SC amplifier arrangement shown, which is connected between the output, in the example shown the first output terminal 13, and the input, in the example shown the first input terminal 11. This compensation circuit 3 comprises a compensation capacitor 31 and a circuit arrangement 32, 33, which is designed to discharge under clock control the compensation capacitor 31 during the first clock phase, and to connect under clock control the compensation capacitor 31 between the first output terminal 13 and the first input terminal 11 during the second clock phase. During the second clock phase, a charging current flows between the first output terminal 13 and the first input terminal 11, which charges the compensation capacitor 31 and which also charges the second input capacitor 15 in a similar manner. This electric charge stored in the second input capacitor 15 during the second clock phase is given by:

$$Q_{C13-2} = Q_{C31-2} = (Vout - Vin) \cdot C31 \tag{3}$$

where $Q_{C13-2}$ denotes the electric charge stored in the second input capacitor 15 during the second clock phase, $Q_{C31-2}$ denotes the electric charge stored in the compensation capacitor 31 during the second clock phase, and C31 denotes the capacitance of the compensation capacitor 31. Complete compensation of the electric charge removed from the second input capacitor 15 in the first clock phase by the electric charge fed back via the compensation capacitor 31 during the second clock phase is then achieved in full if $Q_{C21-1} = Q_{C31-2}$, i.e. if the charge removed in the first clock phase is fed back again during the second clock phase. Using equations (2) and (3), this is the case when the capacitance C31 of the compensation capacitor 31 satisfies the equation:

$$C31 = \frac{C21}{G-1} \tag{4}$$

Both the gain G and the capacitance of the first input capacitor 21 are known. Hence the capacitance of the compensation capacitor 31 required for complete compensation can easily be found using equation (4). It should be pointed out that the explanations given above on the compensation are based on the ideal-case assumption that a frequency at which the input voltage Vin is varying is substantially lower than the clock frequency of the two clock signals $\Phi 1$, $\Phi 2$, and that the first and second input capacitors 21, 15 are designed with regard to the other so that charging of the first input capacitor 21 during a single first clock phase does not result in a significant change in the input voltage Vin.

An ideal operational amplifier shall be assumed initially for the explanation below, i.e. effects of an offset voltage and other non-ideal cases such as a finite open-loop gain of the operational amplifier are disregarded initially. The explanations given in connection with equation (3) regarding the electric charge fed back into the input capacitor 15 during the second clock phase apply to such an ideal operational amplifier. Even if these ideal conditions should not exist, the compensation circuit 3 still produces a significant reduction in a measurement error that is caused by the clock-controlled discharge of the second input capacitor 15.

Figure 3:
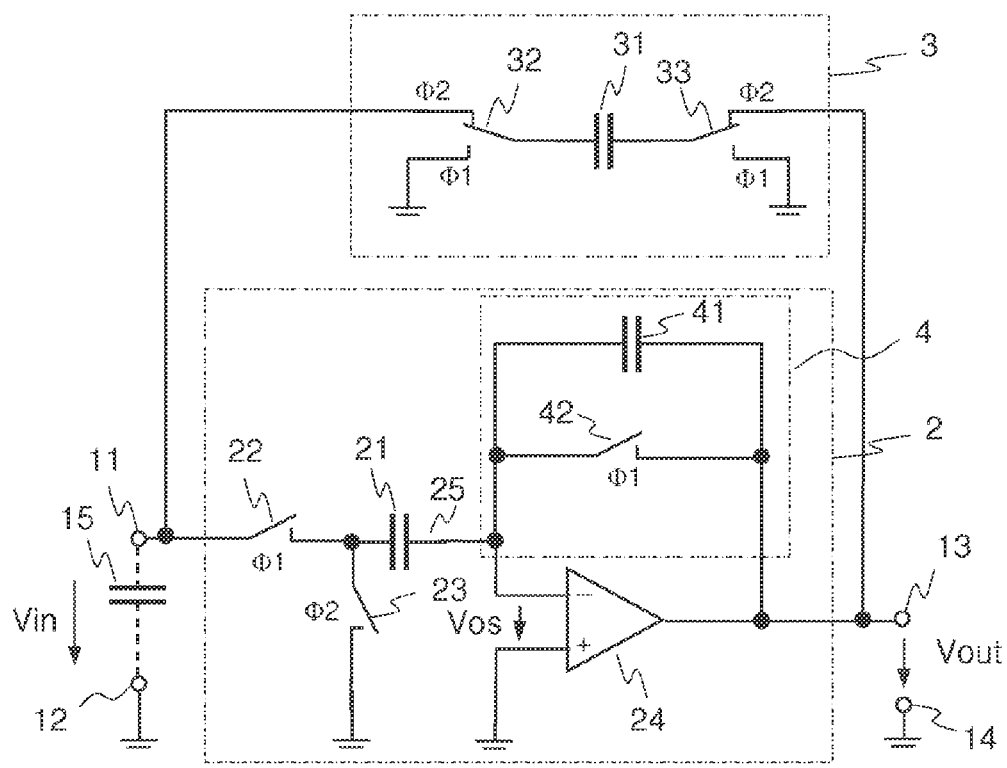
FIG. 3 shows a first example of a feedback circuit of the SC amplifier stage.

FIG. 3 shows a first example of a feedback circuit 4. In order to help understanding, FIG. 3 not only shows this feedback circuit 4 but also the other circuit components already explained from FIG. 1. The feedback circuit 4 shown comprises the switched feedback capacitor 41, which in the example shown is connected between the amplifier output and the first amplifier input, and a third switch 42, which is designed to discharge under clock control the feedback capacitor 41 during the first clock phase. In the example shown, this switch 42 is connected between connecting terminals of the feedback capacitor 41. A capacitance ratio between the capacitance C21 of the first input capacitor 21 and a capacitance C41 of the feedback capacitor 41 defines the gain factor G for this SC amplifier stage 2, as explained below. In this SC amplifier stage, during the second clock phase, electric charge that has been stored in the first input capacitor 21 during the previous first clock phase, is stored in the feedback capacitor 41. Hence $$Q_{C21-1} = Q_{C41-2} \quad (5)$$

where $Q_{C41-2}$ is the electric charge stored in the feedback capacitor 41 during the second clock phase.

Taking into account the offset voltage, the following is true for the feedback circuit in FIG. 3:

$$Vout = \frac{C21}{C41} \cdot Vin - Vos \quad (5a)$$

The gain factor G equals the quotient of the input capacitor and feedback capacitor:

$$G = \frac{\Delta Vout}{\Delta Vin} = \frac{C21}{C41} \quad (6)$$

Figure 4:
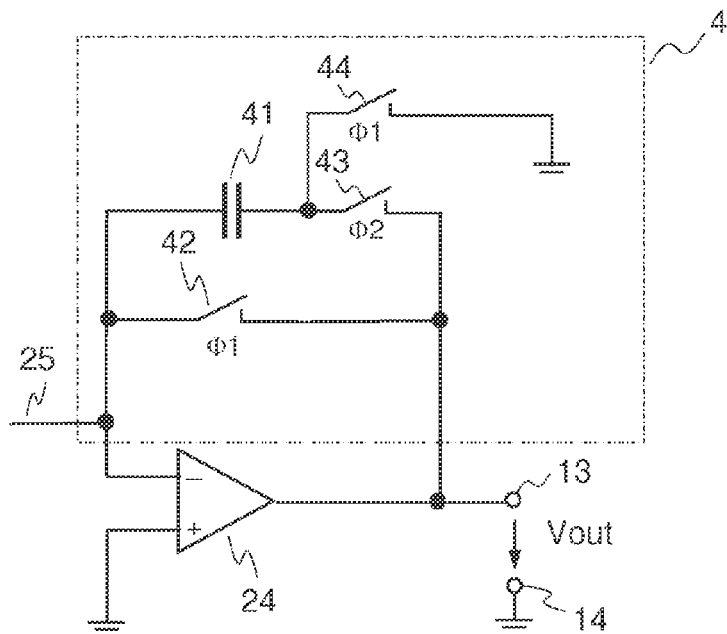
FIG. 4 shows a second example of the feedback circuit of the SC amplifier stage.

FIG. 4 shows a second example of a feedback circuit 4 providing automatic correction of an output offset voltage. This feedback circuit 4 differs from the feedback circuit 4 explained using FIG. 3 in that two further switches are present in addition to the feedback capacitor 41 and the third switch 42: a fourth switch 43, which is connected between the feedback capacitor 41 and the first output terminal 13, and a fifth switch 44, which is connected between the reference potential and a node common to the feedback capacitor 41 and the fourth switch 43. The fourth switch 43 is controlled by the second clock signal Φ2, and the fourth fifth switch 44 is controlled by the first clock signal Φ1. This feedback circuit 4 is implemented so that the offset voltage of the amplifier 24 that exists between the inputs of the amplifier 24 has no effect on the output voltage Vout i.e. on the gain factor G. in the feedback circuit 4 shown in FIG. 4, the feedback capacitor 41 is charged to the offset voltage Vos (output side negative) during the first phase. During the second clock phase, the feedback capacitor 41 is connected via the fourth switch 43 between the first output terminal 13 and the first amplifier input 25. The offset voltage at the output of the circuit is eliminated, in other words compensated, by the offset voltage stored on the feedback capacitor.

If the amplifier 24 has an offset, the stored charge of the first input capacitor 21 is not fully transferred to the feedback capacitor during the second clock phase, but a charge is retained on the first input capacitor 21 at the end of the clock phase 2, this charge being given by:

$$Q_{C21-2} = C21 \cdot Vos \quad (7)$$

where Vos denotes the offset voltage. In the first clock phase, a charge is transferred to the input capacitor 21, which depends on the difference between the input voltage and the output voltage, and is given by:

$$Q_{C21-2} = C21 \cdot (Vin - Vos) \quad (7a)$$

The component of the charge dependent on the offset voltage Vos is not compensated by the compensation circuit 3 in the arrangements shown in FIGS. 3 and 4. This results in a compensation error that depends on the offset voltage, which can be tolerated in some applications.

Figure 5:
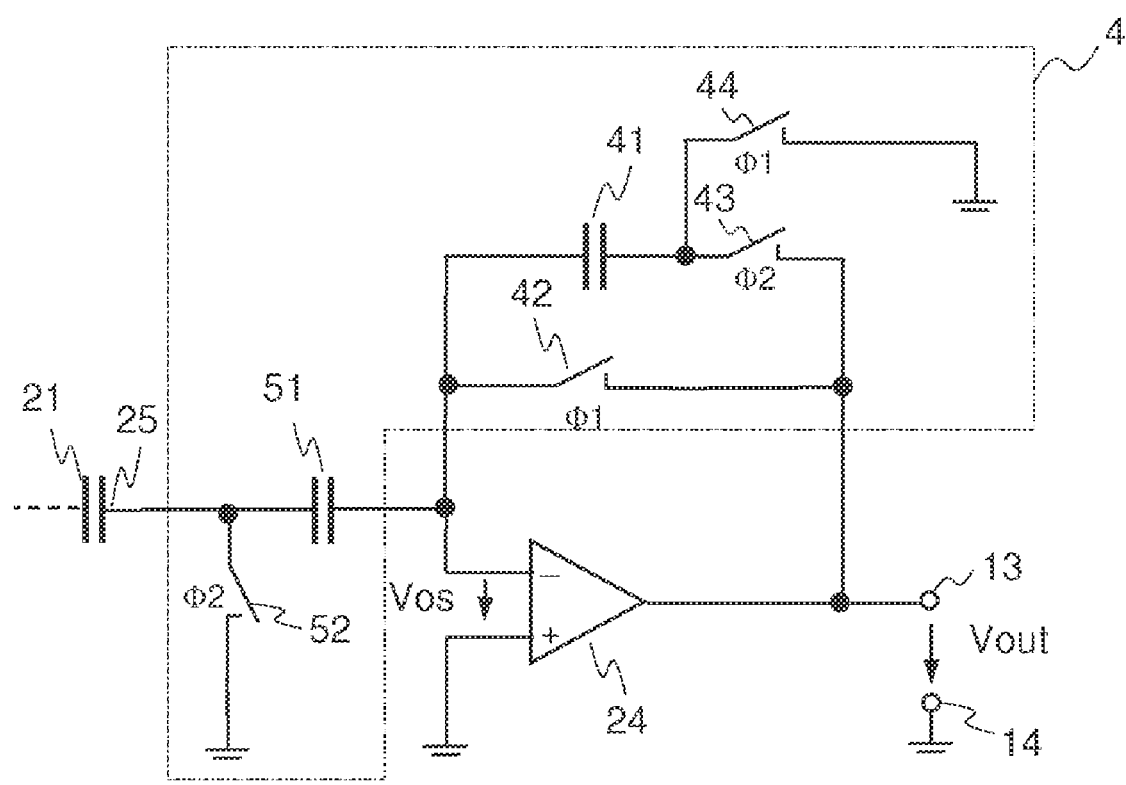
FIG. 5 shows a further example of a feedback circuit, which has an additional capacitor for eliminating a charge compensation error.

FIG. 5 shows an example of a feedback circuit, which is capable of eliminating even the compensation error described. This feedback circuit has an additional capacitor 51, which is connected between the inverting input of the amplifier 24 on one side and the input capacitor 21 and the feedback capacitor 41 on the other. A further switch 52, which is controlled by the first clock signal Φ1, is connected between the terminal for the reference potential and the node 25 common to the input capacitor 21 and the feedback circuit 4.

During the first clock phase, the non-inverting input of the operational amplifier 24 is connected to the output via the switch 42 of the feedback circuit 4, and the offset voltage Vos is stored on the additional capacitor 51, the terminal of which is remote from the inverting input of the operational amplifier 24 lying at the reference potential via the additional additional switch 52 during the first clock phase. The charge transferred to the input capacitor 21, unlike the previously described arrangements, does not depend on the offset voltage Vos, this charge being given by:

$$Q_{C21-1} = C21 \cdot Vin \quad (7b)$$

During the second clock phase, the entire charge stored in the input capacitor 21 is transferred to the feedback capacitor 41. This has the advantage that a compensation error dependent on the offset voltage Vos does not arise. The charge stored in the additional capacitor 51, which depends directly on the offset voltage, corrects the offset in the output signal Vout.

Figure 6:
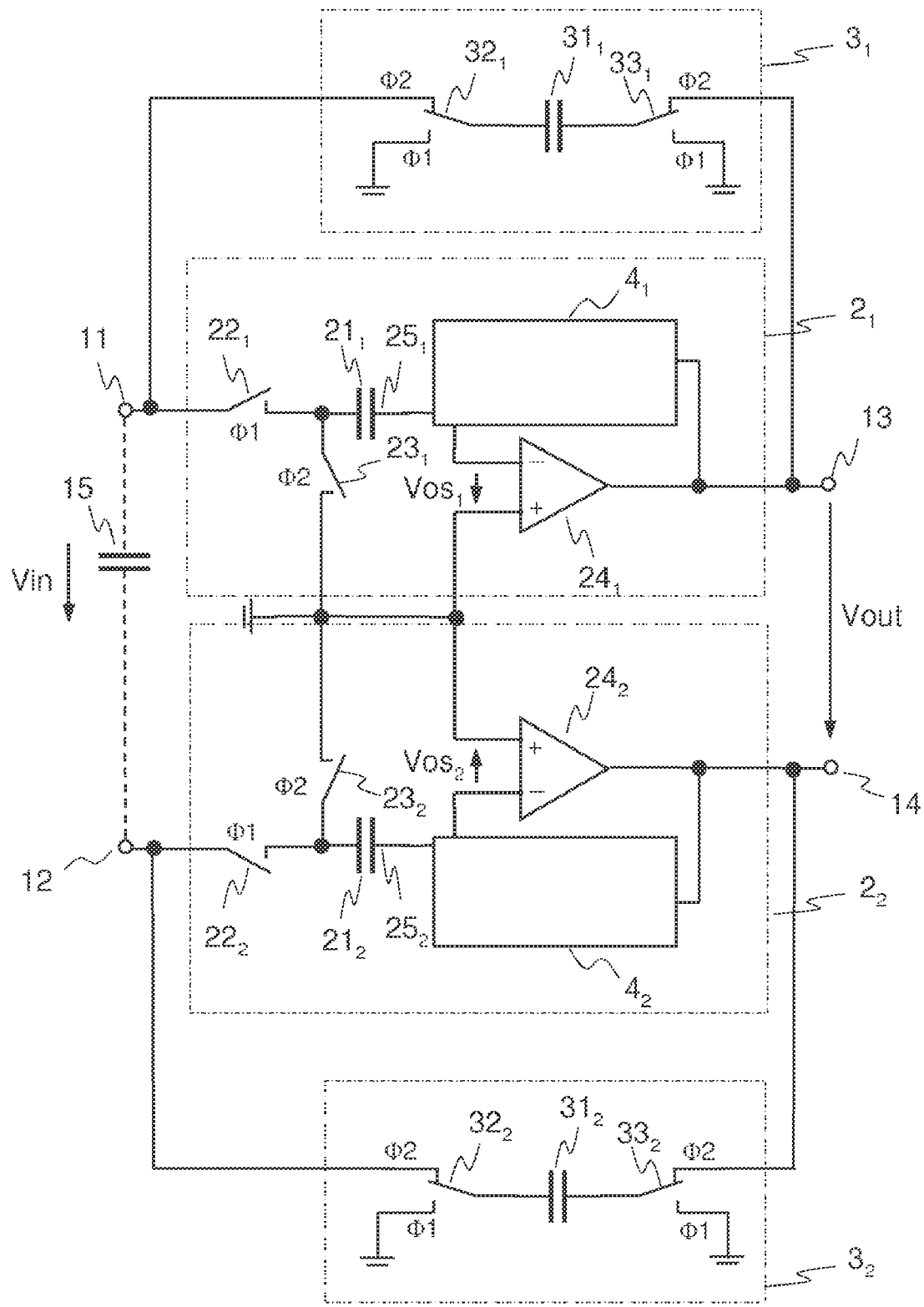
FIG. 6 shows an example of an SC amplifier arrangement in differential path technology, which comprises two SC amplifier stages and two compensation circuits.

FIG. 6 uses an electrical equivalent circuit to show another example of an SC amplifier arrangement. This amplifier arrangement is implemented in differential path technology and comprises two SC amplifier stages $2_1$, $2_2$, a first $2_1$ of which is connected between the first input terminal 11 and the first output terminal 13, and a second $2_2$ of which is connected between the second input terminal 12 and the second output terminal 14. In the SC amplifier stages $2_1$, $2_2$ shown in FIG. 6 circuit components identical to those in the SC amplifier stage 2 shown in FIGS. 1 and 2 are denoted by the same reference numeral, with the index "1" denoting the circuit components of the first SC amplifier stage $2_1$, and the index "2" denoting the circuit components of the second SC amplifier stage $2_2$. The second amplifier inputs of the amplifiers $24_1$, $24_2$ of the SC amplifier stages $2_1$, $2_2$ and the second switches $23_1$, $23_2$ are each connected to the reference potential. The output voltage Vout for this SC amplifier arrangement equals the difference of the two voltages that exist between the respective amplifier outputs of the amplifiers $24_1$, $24_2$ and the reference potential.

The feedback circuits $4_1$, $4_2$ of the SC amplifier stages $2_1$, $2_2$, which are shown simply merely as circuit blocks in FIG. 6 can be any feedback circuits suitable for SC amplifier stages, in particular those feedback circuits that have been described above with reference to FIGS. 3 and 4.

The SC amplifier arrangement shown in FIG. 6 also comprises two compensation circuits: a first compensation circuit $3_1$, which is connected between the first output terminal 13 and the first input terminal 11, and a second compensation circuit $3_2$, which is connected between the second output terminal 14 and the second input terminal 12. These two compensation circuits $3_1$, $3_2$ have the same design as the compensation circuit 3 explained above with reference to FIG. 1. In FIG. 6, circuit components of these compensation circuits $3_1$, $3_2$ identical to those in the compensation circuit 3 shown in FIG. 1 are denoted by the same reference numeral, with the index "1" denoting the circuit components of the first compensation circuit $3_1$, and the index "2" denoting the circuit components of the second compensation circuit $3_2$.

Figure 7:
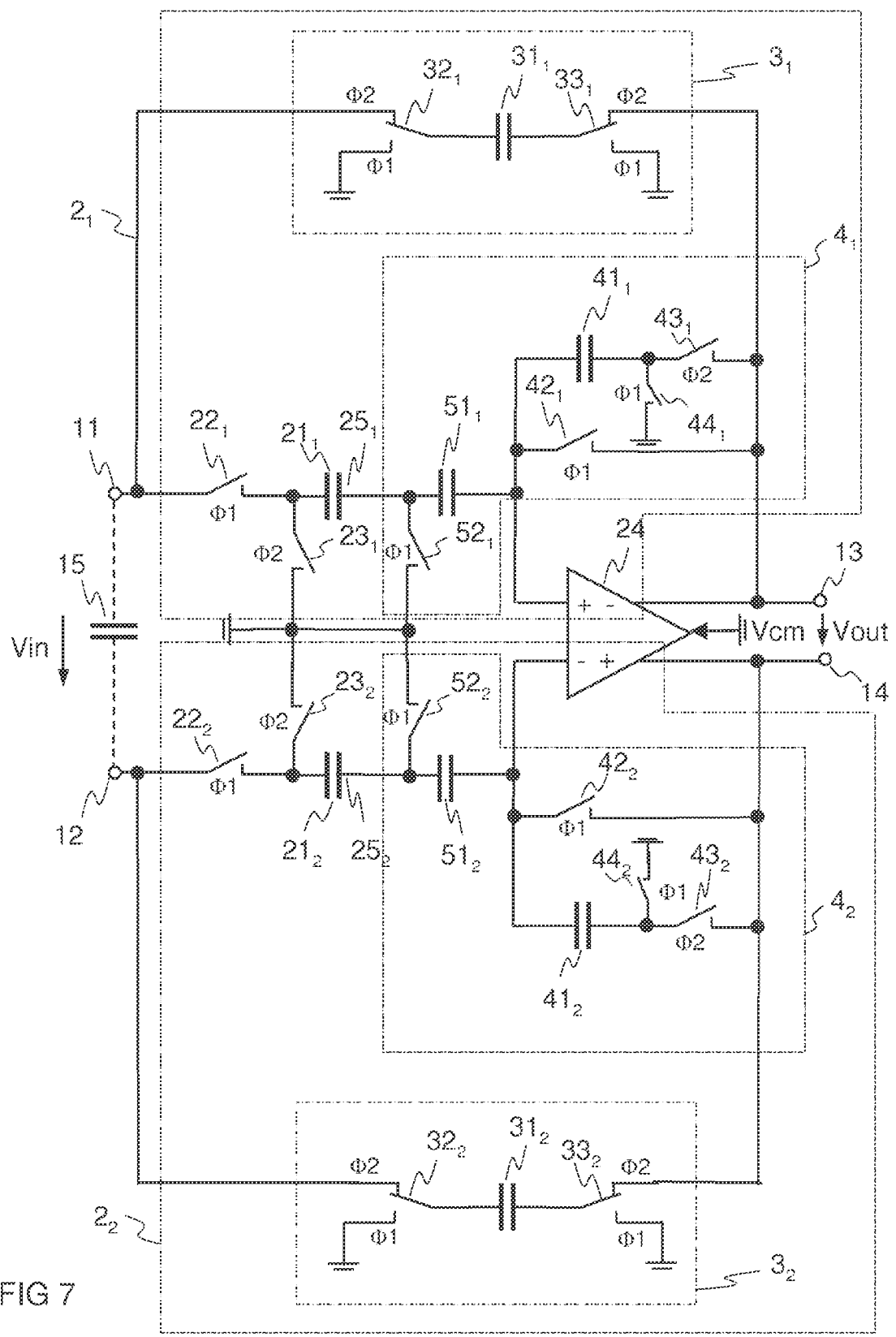
FIG. 7 shows a further example of an SC amplifier arrangement in differential path technology, which comprises a fully differential operational amplifier.

FIG. 7 shows another example of an SC amplifier arrangement having two amplifier stages $2_1$, $2_2$. Instead of two separate operational amplifiers, this amplifier arrangement has a fully differential operational amplifier, which comprises two signal inputs, two signal outputs and a reference voltage input. Each of the respective signal outputs of this operational amplifier, between which the output voltage lies, is connected to one of the respective output terminals 13, 14. A reference voltage or a reference potential Vcm lies at the reference voltage input. This reference potential equals the reference potential at the other reference potential terminals of the circuit, i.e. for example the potential at the terminals to which the compensation capacitors $31_1$, $31_2$ and the feedback capacitors $41_1$, $41_2$ are connected during the first clock phase. This reference potential, for example, equals half of a supply voltage (not shown) that is supplied to the operational amplifier 24. The operational amplifier is designed to regulate a common-mode component of the output voltage to this reference potential.

The feedback circuits $4_1$, $4_2$ of the SC amplifier arrangement shown in FIG. 7 have the same design as the feedback circuit shown in FIG. 5, but could also be implemented in any other manner. Each of these respective feedback circuits $4_1$, $4_2$ is here connected between one of the respective inputs and one of the respective outputs of the operational amplifier 24. The input capacitors $21_1$, $21_2$ are connected up in accordance with the amplifier arrangement shown in FIG. 6 and connected accordingly to the feedback circuits $4_1$, $4_2$.

Figure 8:
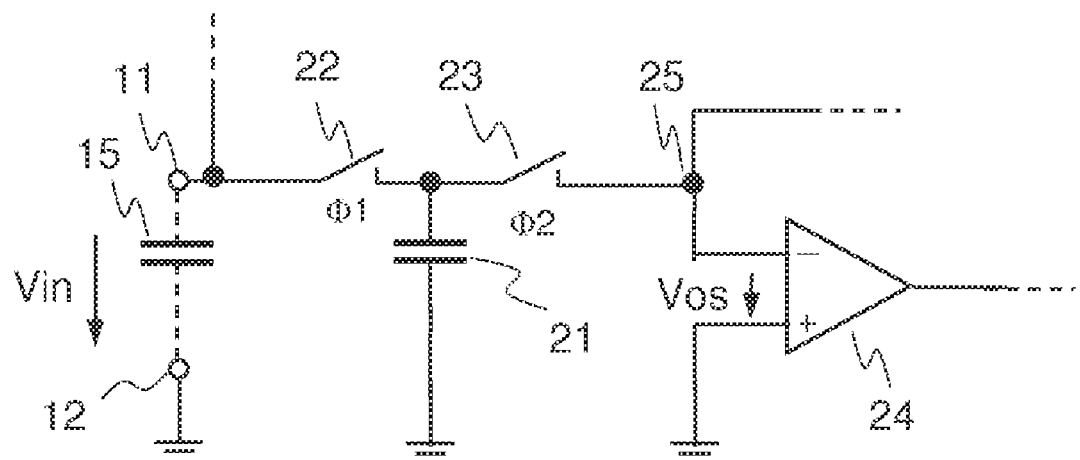
FIG. 8 shows a further example of an SC amplifier stage.

Such an amplifier circuit containing a fully differential operational amplifier 24 is capable of compensating a differential input current, so that only a common-mode input current flows that is proportional to a potential difference between the input voltage Vin and the common-mode voltage Vcm. In addition, if the entire circuit is fully symmetrical, no amplification error or measurement error arises as a result of the input current. It should be pointed out, that the SC amplifier stages described above are merely to be considered as an example. The basic principle, namely providing a compensation circuit, which is connected between the output and the input of the SC amplifier arrangement and which is used to feed back from the output to the input during each second clock phase at least approximately as much charge as was received via the input during the immediately preceding clock phase, can be applied irrespective of the precise implementation of the SC amplifier stage 2 or $2_1$, $2_2$. It should be mentioned in this context, that the first input capacitor 21 need not necessarily be connected between the input and the amplifier. Referring to FIG. 8, there is also the option to connect one terminal of the input capacitor 21 to the reference potential and to switch over under clock control the other terminal of the input capacitor between the input of the SC amplifier arrangement and one of the amplifier inputs by means of the first and second switches 22, 23. Here the first switch 22 is connected between the input of the SC amplifier arrangement and the input capacitor 21, and the second switch 23 is connected between the first input capacitor 21 and one of the amplifier inputs.

Finally, it should be pointed out that features that were explained above in connection with just one example, can also be combined with features of other examples where this has not been stated explicitly. In particular, for instance, features of the claims given below can be combined in any way with each other.

The invention claimed is:

1. A switched capacitor (SC) amplifier circuit comprising:
an input for applying an input voltage and an output for providing an output voltage;
at least one SC amplifier stage comprising
a first input capacitor,
a second input capacitor connected to the input,
at least one switch, which is designed to couple, under clock control, the first input capacitor to the input,
an amplifier, having an amplifier input coupled to the first input capacitor and an amplifier output coupled to the output, and
a feedback circuit coupled between the amplifier output and the amplifier input of the amplifier; and
at least one compensation circuit coupled between the output and the input, the at least one compensation circuit having a compensation capacitor and a switching arrangement, wherein the switching arrangement is designed to couple, under clock control, the compensation capacitor between the output and the input, wherein a ratio between a capacitance of the compensation capacitor and a capacitance of the first input capacitor is given at least approximately by:

$$\frac{C31}{C21} = \frac{1}{G-1}$$

where:
C31 is a capacitance of the compensation capacitor,
C21 is a capacitance of the first input capacitor, and
G is a gain of the SC amplifier stage.

2. The SC amplifier circuit according to claim 1, wherein:
the compensation circuit comprises a discharge circuit, which is designed to discharge the compensation capacitor under clock control and offset in time from clock phases, and
the compensation capacitor is connected between the output and the input.

3. The SC amplifier circuit according to claim 1, wherein the input voltage lies across the second input capacitor.

4. The SC amplifier circuit according to claim 1, wherein the feedback circuit comprises:
a feedback capacitor and a circuit arrangement, which is designed to connect under clock control the feedback capacitor between the output and the amplifier input.

5. The SC amplifier circuit according to claim 4, wherein the circuit arrangement is designed to connect under clock control the feedback capacitor between the output and the amplifier input during first clock phases, and to connect under clock control the feedback capacitor between the output and a terminal for a reference potential during second clock phases.

6. The SC amplifier circuit according to claim 1, comprising:
two input terminals for applying an input voltage and two output terminals for providing an output voltage;
a first SC amplifier stage, which is connected between a first terminal of the two input terminals and a first terminal of the two output terminals, and a second SC amplifier stage, which is connected between a second terminal of the two input terminals and a second terminal of the two output terminals; and
a first compensation circuit, which is connected between a first output terminal and a first input terminal, and a second compensation circuit, which is connected between a second output terminal and a second input terminal.

7. The SC amplifier circuit according to claim 6 comprising a fully differential operational amplifier, which is part of the first SC amplifier stage and the second SC amplifier stage.

8. The SC amplifier according to claim 4, wherein $$G = \frac{C21}{C41},$$

and C41 is the capacitance of the feedback capacitor.

9. The SC amplifier circuit according to claim 6, wherein the second input capacitor is connected between the two input terminals.

10. A method for measuring an input voltage applied to an input, the method comprising:
during first clock phases, clock-controlled charging of an input capacitor to a voltage that depends on the input voltage;
amplifying the voltage across the input capacitor to provide an output voltage at an output; and
feeding back electric charge from the output to the input during second clock phases, wherein the electric charge fed back during a second clock phase equals at least approximately an electric charge that has flowed from the input on to the input capacitor during an immediately preceding first clock phase.

11. A switched capacitor circuit comprising:
a switched capacitor amplifier comprising an input and an output, the switched capacitor amplifier being configured to operate in a first phase and a second phase, wherein the input of the switched capacitor amplifier comprises a substantially higher input capacitance during the first phase than during the second phase, wherein the switched capacitor amplifier comprises
an internal amplifier,
a feedback capacitor network coupled between an input of the internal amplifier and an output of the internal amplifier, and
a first series capacitor comprising a first node and a second node, wherein the first node is configured to be coupled to the input of the switched capacitor amplifier during the first phase, the first node is configured to be coupled to a reference node during the second phase, and the second node is coupled to the input of the internal amplifier; and
an input current compensation circuit coupled between the switched capacitor amplifier input and the switched capacitor amplifier output, the input current compensation circuit comprising a compensation capacitor configured to be coupled between the switched capacitor amplifier input and the switched capacitor amplifier output during the second phase, and configured to be discharged during the first phase.

12. The switched capacitor circuit of claim 11, wherein the reference node comprises ground.

13. The switched capacitor circuit of claim 11, wherein:
the switched capacitor amplifier further comprises a second series capacitor coupled between the second node of the first series capacitor and the input of the internal amplifier; and
the second node of the first series capacitor is configured to be coupled to the reference node during the first phase.

14. The switched capacitor circuit of claim 11, wherein the feedback capacitor network comprises:
a feedback capacitor comprising a first node coupled to the internal amplifier input and a second node coupled to the internal amplifier output;
a first switch coupled between the internal amplifier input and the internal amplifier output, the first switch configured to be more conductive during the first phase than during the second phase;
a second switch coupled between the second node of the feedback capacitor and the output of the internal amplifier, the second switch configured to be more conductive during the second phase than during the first phase; and
a third switch coupled between the second node of the feedback capacitor and the reference node, the first switch configured to be more conductive during the first phase than during the second phase.

15. The switched capacitor circuit of claim 11, wherein:
the switched capacitor amplifier comprises a differential configuration; and
the input current compensation circuit comprises a plurality of compensation circuits.

16. The switched capacitor circuit of claim 15, wherein the internal amplifier comprises a differential amplifier.

17. The switched capacitor circuit of claim 11, wherein:
the switched capacitor amplifier comprises a gain of about G; and
a ratio of compensation capacitor to the first series capacitor is approximately $$\frac{1}{G-1}.$$

18. The switched capacitor circuit of claim 11, wherein the feedback capacitor network comprises:
a feedback capacitor between the internal amplifier input and the internal amplifier output; and
a first switch coupled between the internal amplifier input and the internal amplifier output, the first switch configured to be more conductive during the first phase than during the second phase.

19. The switched capacitor circuit of claim 11, wherein the first phase and the second phase comprise non-overlapping clock phases.

20. A switched capacitor (SC) amplifier circuit comprising:
two input terminals for applying an input voltage and two output terminals for providing an output voltage;
a first SC amplifier stage, which is connected between a first terminal of the two input terminals and a first terminal of the two output terminals, the first SC amplifier stage comprising:

a first amplifier input capacitor, at least one first switch, which is designed to couple, under clock control, the first amplifier input capacitor to the first terminal of the two input terminals, a first amplifier having an input coupled to the first amplifier input capacitor and an amplifier output coupled to the first terminal of the two output terminals, and a first feedback circuit coupled between the output of the first amplifier and the input of the first amplifier; and a second SC amplifier stage, which is connected between a second terminal of the two input terminals and a second terminal of the two output terminals, the second SC amplifier stage comprising:

a second amplifier input capacitor, at least one second switch, which is designed to couple, under clock control, the second amplifier input capacitor to the second terminal of the two input terminals, a second amplifier having an input coupled to the second amplifier input capacitor and an amplifier output coupled to the second terminal of the two output terminals, and a second feedback circuit coupled between the output of the second amplifier and the input of the second amplifier;

a first compensation circuit, which is connected between the first terminal of the two input terminals and the first terminal of the two output terminals, the first compensation circuit comprising a first compensation capacitor and a first switching arrangement, wherein the first switching arrangement is designed to couple, under clock control, the first compensation capacitor between the first terminal of the two input terminals and the first terminal of the two output terminals; and a second compensation circuit, which is connected between the second terminal of the two input terminals and the second terminal of the two output terminals, the second compensation circuit comprising a second compensation capacitor and a second switching arrangement, wherein the second switching arrangement is designed to couple, under clock control, the second compensation capacitor between the second terminal of the two input terminals and the second terminal of the two output terminals.

21. The SC amplifier circuit according to claim 20, further comprising a fully differential amplifier that is a part of the first SC amplifier stage and the second SC amplifier stage.

\* \* \* \* \*